(12) United States Patent
Zou et al.

(10) Patent No.: US 9,286,434 B2
(45) Date of Patent: Mar. 15, 2016

(54) METHODS FOR FABRICATING INTEGRATED CIRCUITS INCLUDING GENERATING PHOTOMASKS FOR DIRECTED SELF-ASSEMBLY (DSA) USING DSA TARGET PATTERNS

(71) Applicant: GLOBALFOUNDRIES, Inc., Grand Cayman, KY (US)

(72) Inventors: Yi Zou, Foster City, CA (US); Wei-Long Wang, Clifton Park, NY (US); Azat Latypov, San Jose, CA (US); Tamer Coskun, San Jose, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 28 days.

(21) Appl. No.: 14/285,739

(22) Filed: May 23, 2014

(65) Prior Publication Data
US 2015/0339429 A1    Nov. 26, 2015

(51) Int. Cl.
*G06F 17/50*    (2006.01)

(52) U.S. Cl.
CPC .................. *G06F 17/5081* (2013.01)

(58) Field of Classification Search
CPC ..... G06F 17/5081; G03F 7/0002; G03F 1/38; G03F 7/70441; G03F 1/36; G03F 1/70
USPC .............................. 716/52, 53, 55
See application file for complete search history.

(56) References Cited

U.S. PATENT DOCUMENTS

| 6,745,380 | B2 | 6/2004 | Bodendorf et al. |
| 7,237,221 | B2 | 6/2007 | Granik et al. |
| 7,861,207 | B2 | 12/2010 | Word et al. |
| 7,903,856 | B2 | 3/2011 | Pfister et al. |
| 8,155,649 | B2 | 4/2012 | McHenry et al. |
| 8,326,313 | B2 | 12/2012 | McHenry et al. |
| 8,336,003 | B2 | 12/2012 | Cheng et al. |
| 2008/0212857 | A1 | 9/2008 | Pfister et al. |

(Continued)

OTHER PUBLICATIONS

Duffy, "An Introduction to Gradient Computation by the Discrete Adjoint Method", Technical report, Florida State University (2009), <http://computationalmathematics.org/topics/files/adjoint-techreport.pdf>.

(Continued)

*Primary Examiner* — Vuthe Siek
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes identifying placement of DSA target patterns in a design layout. The DSA target patterns are grouped into groups including a first group and a first group boundary is defined around the first group. The method further includes determining if a neighboring DSA target pattern to the first group boundary is at least a predetermined minimal keep-away distance from an adjacent DSA target pattern that is within the first group boundary. The method also includes determining if the DSA target patterns in the first group are DSA compatible. An output mask pattern is generated using the first group boundary.

19 Claims, 9 Drawing Sheets

(56) References Cited

U.S. PATENT DOCUMENTS

| | | | |
|---|---|---|---|
| 2010/0075704 | A1 | 3/2010 | McHenry et al. |
| 2010/0097952 | A1 | 4/2010 | McHenry et al. |
| 2010/0105332 | A1 | 4/2010 | McHenry et al. |
| 2010/0173586 | A1 | 7/2010 | McHenry et al. |
| 2011/0209106 | A1* | 8/2011 | Cheng et al. .................. 716/55 |
| 2012/0005634 | A1 | 1/2012 | Seltmann et al. |
| 2012/0141924 | A1 | 6/2012 | Sahouria |
| 2012/0329289 | A1 | 12/2012 | Fujimura et al. |
| 2012/0331428 | A1 | 12/2012 | Cheng et al. |
| 2013/0224635 | A1 | 8/2013 | Takekawa et al. |

OTHER PUBLICATIONS

Giles et aL, "An Introduction to the Adjoint Approach to Design", Flow, Turbulence and Combustion, 65(3-4):393-415, 2000.

Herr, "Directed block copolymer self-assembly for nanoelectronics fabrication", J. Mater. Res., vol. 26, No. 2, Jan. 28, 2011.

Latypov, What is Directed Self-Assembly, Oct. 20, 2011.

Liu et al, "Progress towards the integration of optical proximity correction and directed self-assembly of block copolymers with graphoepitaxy", an oral presentation at the SPIE Advanced Lithography 2012 Symposium, to be published in the SPIE Advanced Lithography 2012 conference proceedings.

Matsen, Self-consistent field theory and its applications. In Soft Matter, vol. 1: Polymer Melts and Mixtures, Edited by G. Gompper and M. Schick (Wiley-VCH, Weinheim, 2006). ISBN: 3-527-30500-9, <http://www.personal.rdg.ac.uk/~sps96mwrn/matsen_scft.pdf>.

USPTO, Office Action for U.S. Appl. No. 13/659,453, mailed Jul. 9, 2013.

USPTO, Response to Office Action for U.S. Appl. No. 13/659,453, mailed Sep. 30, 2013.

USPTO, Notice of Allowance and Fee(s) Due for U.S. Appl. No. 13/659,453, mailed Oct. 15, 2013.

U.S. Appl. No. 13/936,910, filed Jul. 8, 2013.

U.S. Appl. No. 13/936,924, filed Jul. 8, 2013.

Wikipedia contributors, "Penalty method", Wikipedia, The Free Encyclopedia, <http://en.wikipedia.org/w/index.php?&oldid=465609685>. Dec. 13, 2011.

Wikipedia contributors, "Gradient descent", Wikipedia, The Free Encyclopedia, <http://en.wikipedia.org/w/index.php?&oldid=486689439>. Apr. 10, 2012.

Wikipedia contributors, "Newton's method in optimization", Wikipedia, The Free Encyclopedia, <http://en.wikipedia.org/w/index.php?&oldid=480670839>. Mar. 7, 2012.

Wikipedia contributors, "Non-linear least squares", Wikipedia, The Free Encyclopedia, <http://en.wikipedia.org/w/index.php?&oldid=481409505>. Mar. 11, 2012.

Wikipedia contributors, "Gauss-Newton algorithm", Wikipedia, The Free Encyclopedia, <http://en.wikipedia.org/w/index.php?&oldid=478249186>. Feb. 22, 2012.

Wikipedia contributors, "Levenberg—Marquardt algorithm", Wikipedia, The Free Encyclopedia, <http://en.wikipedia.org/w/index.php?&oldid=486636602>. Apr. 10, 2012.

Wikipedia contributors, "Quasi-Newton method", Wikipedia, The Free Encyclopedia, <http://en.wikipedia.org/w/index.php?&oldid=483333808>. Mar. 22, 2012.

Wikipedia contributors, "Conjugate gradient method", Wikipedia, The Free Encyclopedia, <http://en.wikipedia.org/w/index.php&oldid=487492827>. Apr. 15, 2012.

Wikipedia contributors, "Copolymer", Wikipedia, The Free Encyclopedia, <http://en.wikipedia.org/w/index.php?title=Copolymer&oldid=457198836>. Oct. 24, 2011.

Wong et al, "Block copolymer directed self-assembly enables sub-lithographic patterning for device fabrication", an oral presentation at the SPIE Advanced Lithography 2012 Symposium, to be published in the SPIE Advanced Lithography 2012 conference proceedings.

Wong, "Directed Self-Assembly for the Semiconductor Industry", an oral presentation at GLOBALFOUNDRIES, Inc. Feb. 3, 2012.

Xu, Introduction to Directed Self-Assembly (DSA) of Block Copolymer (BCP) in Thin Films, Jun. 29, 2011.

* cited by examiner

METHODS FOR FABRICATING INTEGRATED CIRCUITS INCLUDING GENERATING PHOTOMASKS FOR DIRECTED SELF-ASSEMBLY (DSA) USING DSA TARGET PATTERNS

TECHNICAL FIELD

The technical field relates generally to methods for fabricating integrated circuits, and more particularly relates to methods for fabricating integrated circuits including generating photomasks for directed self-assembly.

BACKGROUND

Decreasing device size and increasing device density has traditionally been a high priority for the manufacturing of integrated circuits. Optical lithography has been a driving force for device scaling. Conventional optical lithography is limited to about 80 nm pitch for single exposure patterning. While double and other multi-patterning processes can realize smaller pitch, these approaches are expensive and more complex.

Directed self-assembly (DSA), a technique that aligns self-assembling polymeric materials on a lithographically defined directing or guide pattern, is a potential option for extending lithography beyond its current pitch and resolution limits. The self-assembling materials, for example, are block copolymers (BCPs) that consist of an "A" homopolymer covalently attached to a "B" homopolymer, which are deposited over a lithographically defined directing pattern on a semiconductor substrate. The lithographically defined directing pattern is a pre-pattern (hereinafter "DSA directing pattern") that is encoded with spatial chemical (e.g., chemical epitaxy) and/or topographical information such as confinement wells (e.g., graphoepitaxy) and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying DSA directing pattern to define a nanopattern (hereinafter "DSA pattern"). Then, by removing either the A polymer block or the B polymer block by wet chemical or plasma-etch techniques, a mask is formed for transferring the DSA pattern to the underlying semiconductor substrate.

Often, patterns that are desired or targeted (hereinafter "DSA target patterns") to be fabricated on a semiconductor substrate via a DSA process are created in a design layout during the design phase of an integrated circuit. Generating a photomask for lithographically defining a DSA directing pattern to form the shape of a DSA pattern that accurately corresponds to the shape of a DSA target pattern requires proper accounting of a multitude of physical effects that occur during the DSA process including from photomask writing on through to etching of the phase separated self-assembly materials to form the DSA pattern. For instance, a typical DSA process involves fabrication of a patterned photomask to be used to make the DSA directing pattern, exposing this photomask in a lithographic tool to photoresist that is disposed on a semiconductor substrate, developing the exposed resist, processing the semiconductor substrate to create the DSA directing pattern, spin coating the pre-patterned semiconductor substrate with BCP, and annealing and developing the BCP to form the DSA pattern, followed by a transfer of the pattern of the developed BCP into the substrate by means of etching. Unfortunately, current approaches for defining DSA directing patterns to form the shapes of DSA patterns that correspond to the shape of DSA target patterns do not fully account for the physical effects that occur during the DSA process and/or the DSA target patterns themselves are not DSA compatible so as to be accurately or fully formed via the DSA process.

Accordingly, it is desirable to provide methods for fabricating integrated circuits including generating a photomask for lithographically defining a DSA directing pattern to form a DSA pattern that accurately corresponds to a DSA target pattern. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes using a computing system, generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes identifying placement of DSA target patterns in a design layout. The DSA target patterns are grouped into groups including a first group and a first group boundary is defined around the first group. The method further includes determining if a neighboring DSA target pattern that is positioned adjacent to and outside of the first group boundary is at least a predetermined minimal keep-away distance from an adjacent DSA target pattern that is within the first group boundary. The method also includes determining if the DSA target patterns in the first group are DSA compatible if the neighboring DSA target pattern is at least the predetermined minimal keep-away distance from the adjacent DSA target pattern. An output mask pattern is generated using the first group boundary if the DSA target patterns in the first group are DSA compatible.

In accordance with another exemplary embodiment, a method for fabricating an integrated circuit is provided. The method includes using a computing system, generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes identifying placement of DSA target patterns in a design layout. The DSA target patterns are grouped into groups including a first group and a first group boundary is defined around the first group. The method further includes determining if a neighboring DSA target pattern that is positioned adjacent to and outside of the first group boundary is less than a predetermined minimal keep-away distance from an adjacent DSA target pattern that is within the first group boundary. The first group boundary is adjusted to include the neighboring DSA target pattern and the first group to define an adjusted first group boundary around an adjusted first group that includes the first group and the neighboring DSA target pattern if the neighboring DSA target pattern is less than the predetermined minimal keep-away distance from the adjacent DSA target pattern. The method also includes determining if the DSA target patterns in the adjusted first group are DSA compatible. An output mask pattern is generated using the adjusted first group boundary if the DSA target patterns in the adjusted first group are DSA compatible.

In accordance with another exemplary embodiment, a method for fabricating an integrated circuit is provided. The method includes using a computing system, generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes checking DSA target patterns that are defined in a design layout and that are grouped into groups including a first group that is within a first group boundary. Checking the DSA target patterns include checking if a neighboring DSA target pattern that is positioned adjacent to and outside of the first group boundary is less than a predetermined minimal keep-away distance from an adjacent DSA target pattern that is within the first group boundary. The DSA target patterns in the first group are compared to acceptable DSA target patterns and/or unacceptable DSA target patterns that are contained in a DSA pattern library to determine if the DSA target patterns in the first group are DSA compatible. An output mask pattern is generated using the first group boundary if the DSA target patterns in the first group are DSA compatible.

BRIEF DESCRIPTION OF THE DRAWINGS

The various embodiments will hereinafter be described in conjunction with the following drawing figures, wherein like numerals denote like elements, and wherein:

FIGS. 10a-12b illustrate, in top views, various DSA target patterns from a DSA pattern library in accordance with an exemplary embodiment;

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein generate a photomask for forming a DSA directing pattern (e.g., confinement well) overlying a semiconductor substrate. The DSA directing pattern is for guiding a self-assembly material (e.g., block copolymer (BCP)) that is deposited on the DSA directing pattern and that undergoes directed self-assembly (DSA), e.g., phase separation during annealing, to form a DSA pattern. In an exemplary embodiment, generating the photomask includes identifying the positions or placement of DSA target patterns in a design layout of an integrated circuit. The DSA target patterns are the desired or predetermined DSA patterns, e.g., contact hole patterns, other via patterns, and/or the like, that are to be fabricated on the semiconductor substrate by the DSA process. The DSA target patterns are grouped into groups including a first group and a first group boundary is defined around the first group. A determination is then made as to whether or not there are any space violations (e.g., too close or not enough space for reticle or photomask imaging and/or other image transfer steps) between neighboring DSA target patterns that are positioned adjacent to and outside of the first group boundary and corresponding adjacent DSA target patterns that are within the first group boundary. If there are no space violations, a determination is then made as to whether or not the DSA target patterns in the first group are DSA compatible (e.g., can be accurately or fully fabricated by the DSA process). In an exemplary embodiment, using a DSA pattern library, the DSA target patterns in the first group are compared to acceptable DSA target patterns (e.g., predetermined patterns that can be accurately or fully fabricated on a semiconductor substrate via the DSA process) and/or unacceptable DSA target patterns (e.g., predetermined patterns that cannot be accurately or fully fabricated on a semiconductor substrate via the DSA process) in the DSA pattern library to determine if the DSA target patterns in the first group are DSA compatible. In an exemplary embodiment, if the DSA target patterns in the first group are DSA compatible, a DSA model is used to adjust or modify the first group boundary to generate an output mask pattern. In particular, the DSA model is used to simulate the DSA fabricated pattern(s) given the first group boundary and/or adjusted or modified versions of the first group boundary taking into account the physical effects that occur during the DSA process including annealing and etching of the self-assembly material.

In an exemplary embodiment, alternatively, if there are any space violations between a neighboring DSA target pattern that is outside of the first group boundary and an adjacent DSA pattern that is in the first group and/or if the DSA target patterns that are in the first group are not DSA compatible, then the first group boundary is adjusted to eliminate the space violations and/or the DSA target patterns are redesigned (e.g., repositioned) to be DSA compatible and to define DSA target patterns within an adjusted first group and an adjusted first group boundary that is disposed around the adjusted first group. In an exemplary embodiment, the DSA model is used to further adjust or modify the adjusted first group boundary to generate the output mask pattern by taking into account the physical effects that occur during the DSA process.

The output mask pattern is written on the photomask to produce a patterned photomask. In an exemplary embodiment, because a multitude of physical effects that occur during the DSA process have been accounted for in producing the output mask pattern, the patterned photomask can be used to lithographically transfer the output mask pattern onto the semiconductor substrate to define a DSA directing pattern that can be used to form the DSA pattern(s) that accurately correspond to the DSA target pattern(s).

Figure 1:
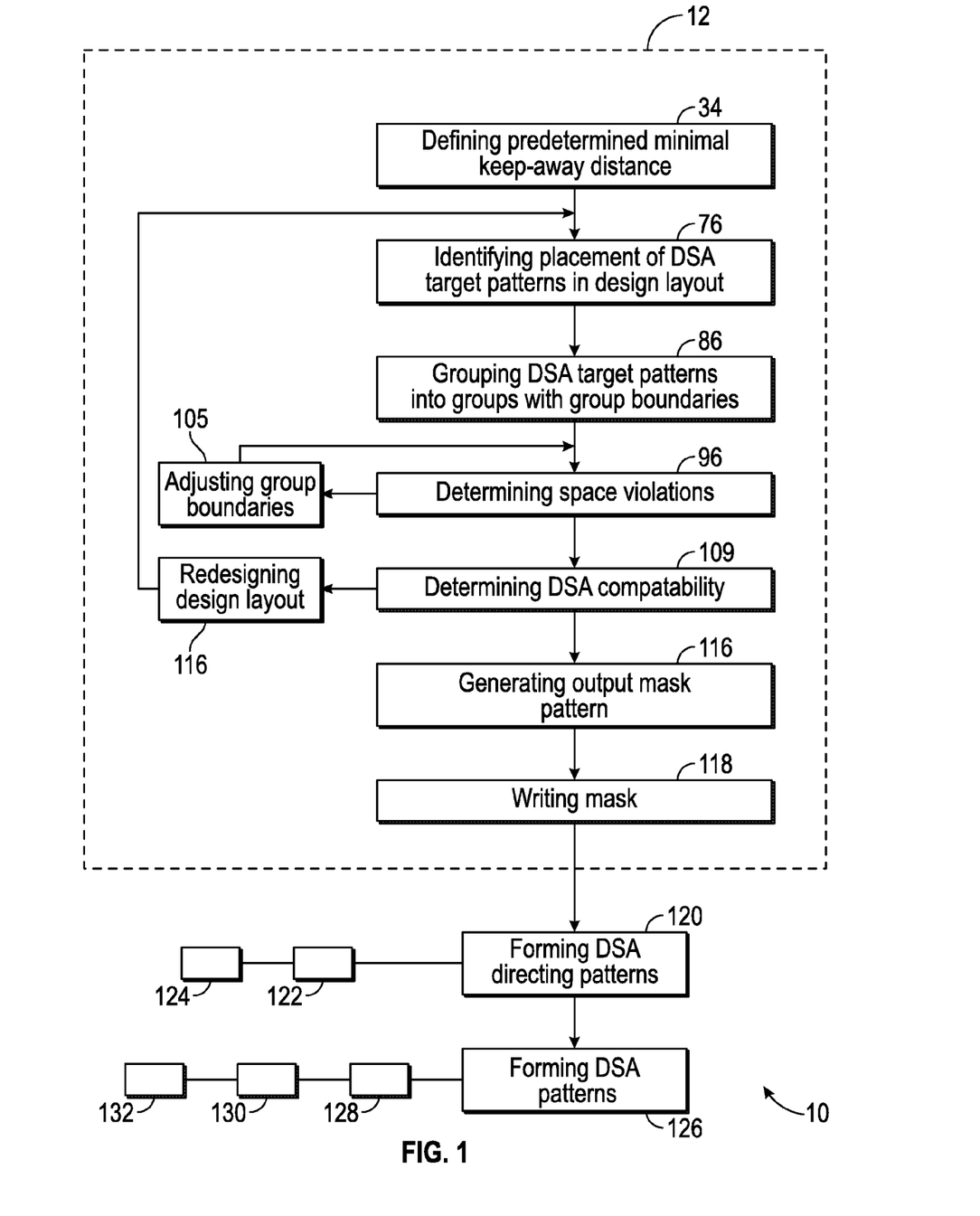
FIG. 1 is a block diagram of a method for fabricating an integrated circuit in accordance with an exemplary embodiment.

FIG. 1 is a block diagram of a method 10 for fabricating an integrated circuit (IC) in accordance with an exemplary embodiment. The described process steps, procedures, and materials are to be considered only as exemplary embodiments designed to illustrate to one of ordinary skill in the art methods for practicing the embodiments contemplated herein; the methods are not limited to these exemplary embodiments. Various steps in the manufacture of ICs are well known and so, in the interest of brevity, many conventional steps will only be mentioned briefly herein or will be omitted entirely without providing the well-known process details.

The method 10 includes generating a photomask (step 12) for forming a DSA directing pattern overlying a semiconductor substrate. The photomask may be, for example, an optical lithography photomask or an extreme ultraviolet (EUV) lithography photomask. The DSA directing pattern is for guiding a DSA material deposited on the DSA directing pattern during a DSA process in which the DSA material undergoes directed self-assembly (e.g., nano-size/scale phase separation that is registered to the DSA directing pattern) to form a DSA pattern.

Figure 2:
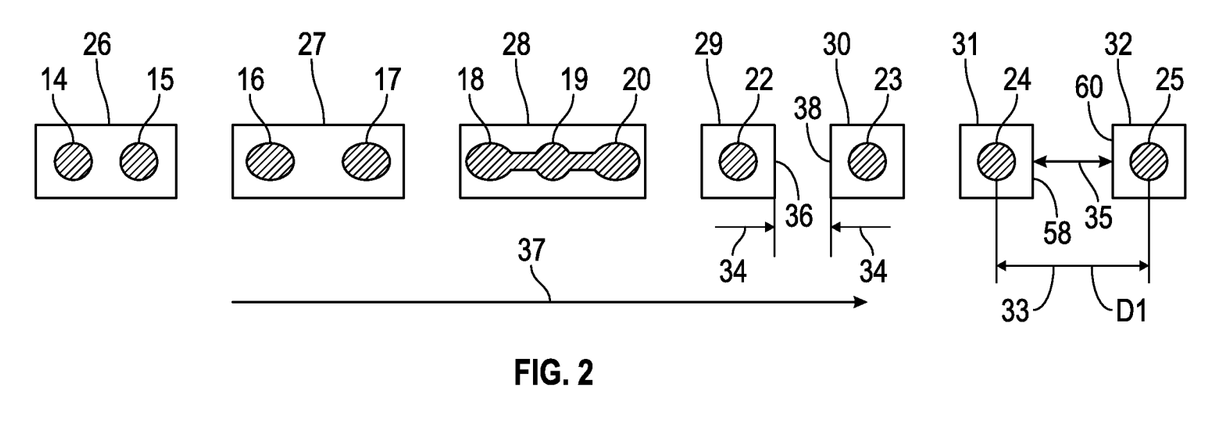
FIG. 2 illustrates, in top views, various DSA patterns and associated DSA directing patterns for defining a predetermined minimal keep-away distance in accordance with an exemplary embodiment.

FIG. 2 illustrates various DSA patterns (e.g., contact hole patterns) 14, 15, 16, 17, 18, 19, 20, 22, 23, 24, and 25 and associated DSA directing patterns (e.g., confinement well patterns) 26, 27, 28, 29, 30, 31, and 32 that generally represent the manufacturing feasibility of imaging and fabricating these patterns 14-32 with respect to optical, reticle (e.g., photomask), and DSA resolutions and pitch (e.g., spacing) in accordance with an exemplary embodiment. With reference to FIGS. 1-2, the manufacturing feasibility of fabricating the DSA patterns 14, 15, 16, 17, 18, 19, 20, 22, 23, 24, and 25 and the associated DSA directing patterns 26, 27, 28, 29, 30, 31, and 32 is determined for defining a predetermined minimal keep-away distance (indicated by double headed arrow 33) between two neighboring DSA patterns 24 and 25 correspondingly disposed within separate DSA directing patterns 31 and 32 (step 34) in accordance with an exemplary embodiment. More specifically, the pitch or spacing between paired DSA patterns 14 and 15, 16 and 17, 18 and 20, 22 and 23, and 24 and 25 progressively increases from the left side to the right side (indicated by arrow 37) of FIG. 2. The specific pitch or spacing and the incremental increases of the spacing between the paired DSA patterns 14 and 15, 16 and 17, 18 and 20, 22 and 23, and 24 and 25 with respect to the manufacturing feasibility of fabricating these paired DSA patterns 14 and 15, 16 and 17, 18 and 20, 22 and 23, and 24 and 25 are dependent on several factors. These factors include the particular mask writing equipment used to generate the photomask, the particular lithographical technique used to transfer the patterns from the photomask to a photoresist layer on a semiconductor substrate, the particular block copolymer (BCP) used in the DSA process to form the DSA patterns, and the like. Therefore, in an exemplary embodiment, the specific pitch or spacing and the incremental increases between the paired DSA patterns 14 and 15, 16 and 17, 18 and 20, 22 and 23, and 24 and 25 with respect to their manufacturing feasibility are determined (e.g., experimentally and/or via simulation or modeling) on a case-by-case basis and are represented here only generally for illustrative purposes.

The paired DSA patterns 14 and 15 with the corresponding DSA directing pattern 26 and the paired DSA patterns 16 and 17 with the corresponding DSA directing pattern 27 independently represent two contact hole patterns spaced apart from each other within a single confinement well pattern that can be lithographically defined and formed using the DSA process onto a semiconductor substrate. As such, the paired DSA patterns 14 and 15 and independently the paired DSA patterns 16 and 17 have an "acceptable pitch" because they can be accurately or fully fabricated using the DSA process.

The paired DSA patterns 18 and 20 with the corresponding DSA directing pattern 28 represents two contact hole patterns spaced apart from each other within a single confinement well pattern in which the paired DSA patterns 18 and 20 undesirably merge together to form three overlapping DSA patterns 18, 19, and 20 within the single confinement well pattern. As such, the DSA patterns 18 and 20 have a "forbidden pitch" because it is not feasible to lithographically define and form the DSA patterns 18 and 20 by the DSA process as two distinct contact hole patterns given their pitch.

The paired DSA patterns 22 and 23 with the corresponding DSA directing patterns 29 and 30 represents two contact hole patterns spaced apart from each other within separate confinement well patterns in which the edges 36 and 38 of the two DSA directing patterns 29 and 30 are too close to each other to be accurately or fully written on a photomask because the edge-to-edge distance (indicated by arrows 34) is below a "reticle feasibility limit." In an exemplary embodiment, the reticle feasibility limit is a manufacturing feasibility limit that is defined by a photomask manufacture with respect to their mask writing resolution capability to accurately or fully write a pattern(s) to a photomask and is dependent on the manufacture's particular mask writing equipment. As such, the paired DSA patterns 22 and 23 have a "forbidden pitch" because it is not feasible to lithographically define and accurately or fully form the DSA patterns 22 and 23 by the DSA process as two distinct contact hole patterns correspondingly in separate confinement well patterns given their pitch.

The paired DSA patterns 24 and 25 with the corresponding DSA directing patterns 31 and 32 represents two contact hole patterns spaced apart from each other within separate confinement well patterns in which the two DSA directing patterns 31 and 32 have sufficient space between each other (e.g., sufficient space between the edges 58 and 60) to be accurately or fully written on a photomask because the edge-to-edge distance (indicated by arrows 35) is at or just above the "reticle feasibility limit." As such, the paired DSA patterns 24 and 25 have an "acceptable pitch" that defines the predetermined minimal keep-away distance 33 and therefore, can be lithographically defined and accurately or fully formed as two distinct contact hole patterns correspondingly in separate confinement well patterns. In an exemplary embodiment, the predetermined minimal keep-away distance 33 is a predetermined edge-to-edge confinement well resolution minimal keep-away distance (D1) in which the edges 58 and 60 of the DSA directing patterns 31 and 32 are directly facing each other (e.g., the DSA directing patterns 31 and 32 are aligned along a vertical axis or a horizontal axis).

Figure 3:
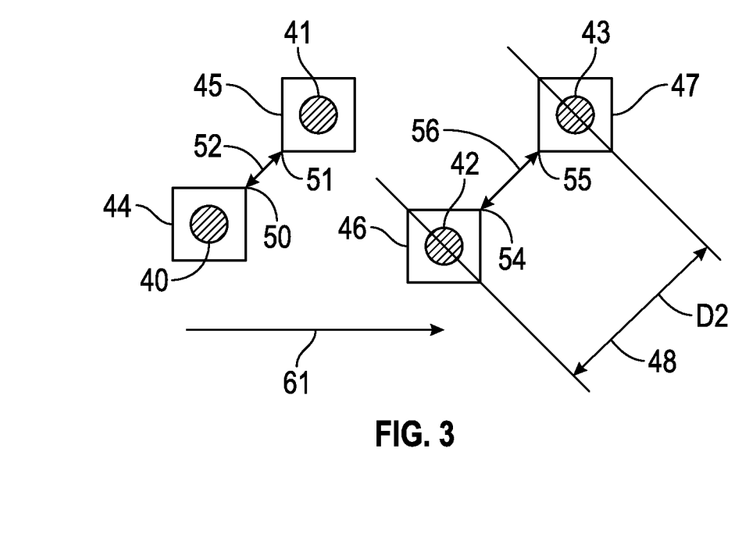
FIG. 3 illustrates, in top views, various DSA patterns and associated DSA directing patterns for defining a predetermined minimal keep-away distance in accordance with an exemplary embodiment.

FIG. 3 illustrates various DSA patterns (e.g., contact hole patterns) 40, 41, 42, and 43 and associated DSA directing patterns (e.g., confinement well patterns) 44, 45, 46, and 47 that generally represent the manufacturing feasibility of imaging and fabricating these patterns 40-47 with respect to optical, reticle, and DSA resolutions and pitch in accordance with an exemplary embodiment. With reference to FIGS. 1 and 3, the manufacturing feasibility of fabricating the DSA patterns 40, 41, 42, and 43 and the associated diagonally disposed DSA directing patterns 44, 45, 46, and 47 is determined for defining an additional predetermined minimal keep-away distance (step 34 in FIG. 1 and indicated by double headed arrow 48 in FIG. 3) between two neighboring DSA patterns 42 and 43 correspondingly disposed within separate diagonally disposed DSA directing patterns 46 and 47 in accordance with an exemplary embodiment. More specifically, the pitch or spacing between paired DSA patterns 40 and 41, and 42 and 43 progressively increases from the left side to the right side (indicated by arrow 61) of FIG. 3. As discussed above, the specific pitch or spacing and the incremental increases of the spacing between the paired DSA patterns 40 and 41, and 42 and 43 with respect to the manufacturing feasibility of fabricating these paired DSA patterns 40 and 41, and 42 and 43 are dependent upon several factors such as the particular mask writing equipment used to generate the photomask, the particular lithographical technique used to transfer the patterns from the photomask to a photoresist layer on a semiconductor substrate, the particular block copolymer (BCP) used in the DSA process to form the DSA patterns, and the like. Therefore, in an exemplary embodiment, the specific pitch or spacing and the incremental increases between the paired DSA patterns 40 and 41, and 42 and 43 with respect to manufacturing feasibility are determined on a case-by-case basis and are represented here only generally for illustrative purposes.

The paired DSA patterns 40 and 41 with the corresponding diagonally disposed DSA directing patterns 44 and 45 represents two contact hole patterns spaced apart from each other within separate diagonally disposed confinement well patterns in which the corners 50 and 51 of the two DSA directing patterns 44 and 45 are too close to each other to be accurately or fully written on a photomask because the corner-to-corner distance (indicated by double headed arrow 52) is below a "reticle feasibility limit." As such, the DSA patterns 40 and 41 have a "forbidden pitch" because it is not feasible to lithographically define and accurately or fully form the DSA patterns 40 and 41 by the DSA process as two distinct contact hole patterns correspondingly in separate diagonally disposed confinement well patterns given their pitch.

The DSA patterns 42 and 43 with the corresponding diagonally disposed DSA directing patterns 46 and 47 represents two contact hole patterns spaced apart from each other within separate diagonally disposed confinement well patterns in which the corners 54 and 55 of the two DSA directing patterns 46 and 47 have sufficient space between each other to be written on a photomask because the corner-to-corner distance (indicated by arrows 56) is at or just above the "reticle feasibility limit." As such, the DSA patterns 42 and 43 have an "acceptable pitch" that defines the predetermined minimal keep-away distance 48 and therefore, can be lithographically defined and formed as two distinct contact hole patterns correspondingly in separate confinement well patterns. In an exemplary embodiment, the predetermined minimal keep-away distance 48 is a predetermined corner-to-corner confinement well resolution minimal keep-away distance (D2) in which the corners 54 and 55 of the DSA directing patterns 46 and 47 are disposed generally diagonally from each other (e.g., the DSA directing patterns 46 and 47 are aligned along a diagonal axis that is between a vertical axis and a horizontal axis).

Figure 4:
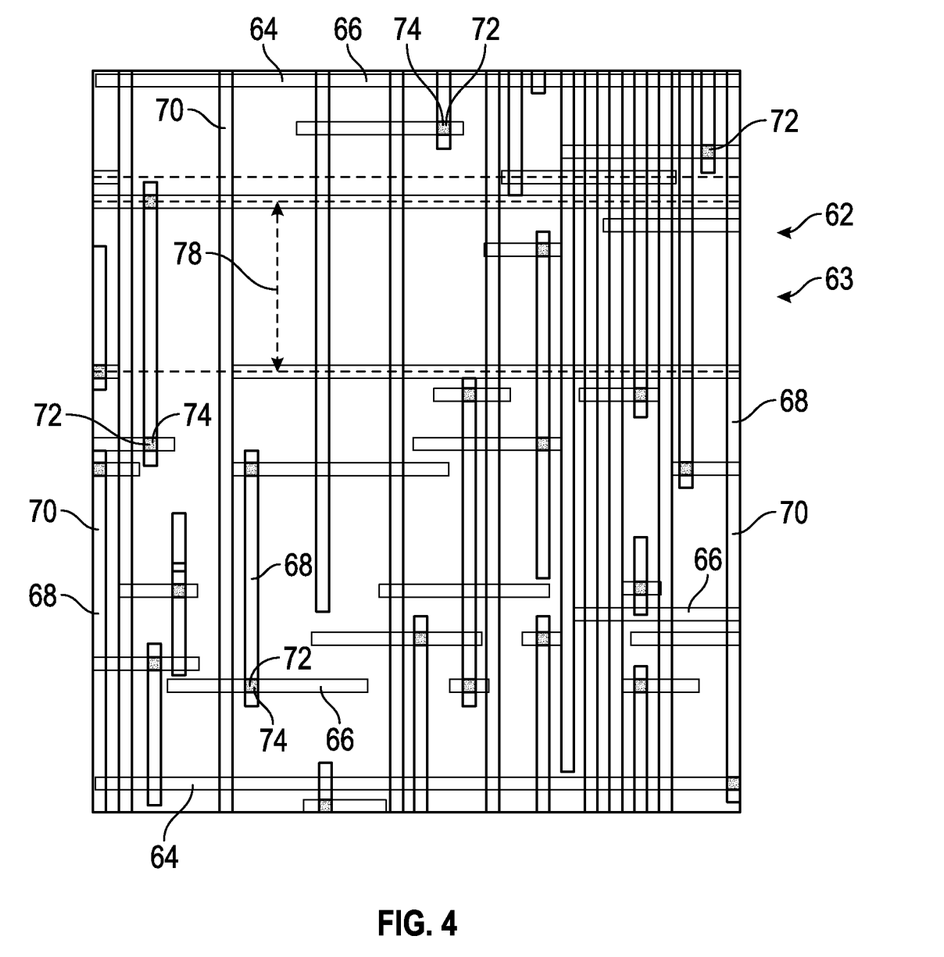
FIG. 4 illustrates, in a top view, a design layout of a portion of an integrated circuit in accordance with an exemplary embodiment.

FIG. 4 illustrates a design layout 62 of a portion of an integrated circuit in accordance with an exemplary embodiment. With reference to FIGS. 1 and 4, the design layout 62 provides a detailed design of the portion of the integrated circuit including placement or routing of networks of interconnect wiring that are used to connect the various semiconductor devices of the integrated circuit. Multiple levels of interconnect wiring form a plurality of metallization layers that connected together to form a back-end-of-the-line ("BEOL") interconnect structure 63 as is well-known in the art. As illustrated in FIG. 4, lines 64 (e.g., wiring) run parallel in the horizontal direction to form a lower metallization layer 66 (e.g., M2 layer) and lines 68 (e.g., wiring) run parallel in the vertical direction to form an upper metallization layer 70 (e.g., M3 layer). Between the lower and upper metallization layers 66 and 70 are contact hole patterns 72 (or other via patterns) that extend between overlapping portions of the lines 64 and 68 to interconnect the lines 64 and 68. In an exemplary embodiment, the contact hole patterns 72 represent DSA target patterns 74. The term "DSA target patterns" is used herein to denote the patterns that are desired or predetermined to be fabricated on a semiconductor substrate using the DSA process. For instance, these patterns may include lines and spaces, isolated lines, contact hole patterns, and other features, e.g., typically polygon type features needed for IC fabrication.

In an exemplary embodiment, the design layout 62 is an ultra-regular design layout in which the lines 64 or 68 of the corresponding metallization layer 66 or 70 have a pitch or are spaced apart from each other a distance (indicated by double headed arrow 78) that corresponds to the formula of (n)(S) where n is an integer of 1 or greater and S is a linear dimension of from about 40 to about 60 nm, such as from about 45 to about 50 nm, for example about 48 nm. As such, in an exemplary embodiment, because the DSA target patterns 74 extend between overlapping portions of the lines 64 and 68, the DSA target patterns 74 have a pitch along the vertical direction and independently along the horizontal direction consistent with the formula of (n)(S). The terms "horizontal" and "vertical" are used herein only in the context of the figures to identify lines in the horizontal direction of the page and vertical lines in the vertical direction of the page and are not meant to limit the exemplary embodiments.

The placement of the DSA target patterns 74 is identified in the design layout 62 (step 76) by determining the locations or relative positions of the DSA target patterns 74. For example, the locations or relative positions of the DSA target patterns 74 can be determined using a computer aided design (CAD) program or other design related software program that is operating on a computing system as will be described in further detail below.

Figure 5:
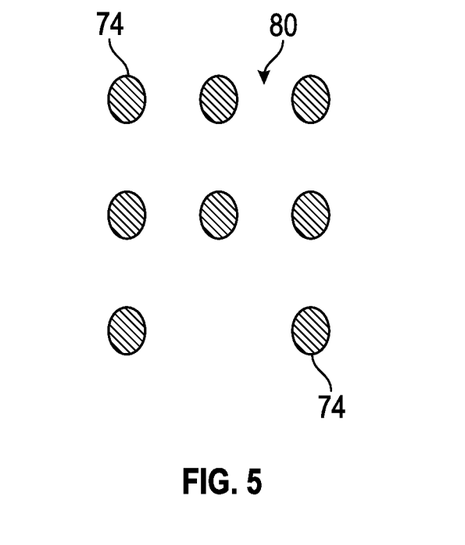
FIGS. 5-9 illustrate, in top views, DSA target patterns and a method for defining a group boundary around the DSA target patterns in accordance with an exemplary embodiment.
Figure 6:
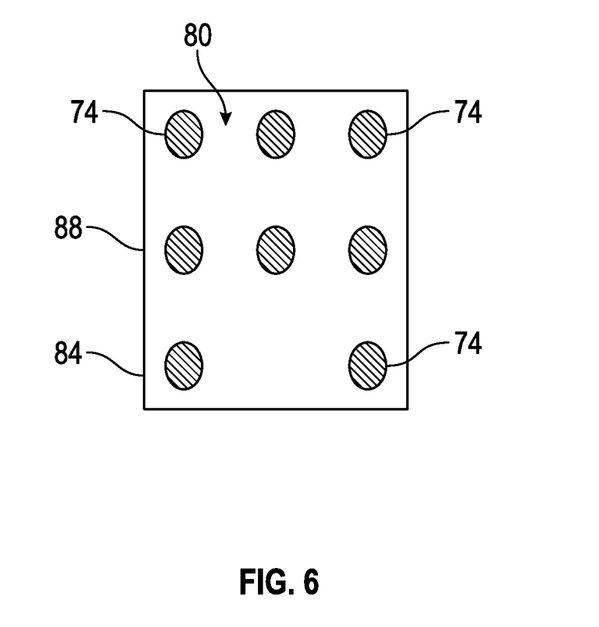

The method 10 continues as illustrated in FIGS. 1 and 5-6 by, using the computing system, grouping the DSA target patterns 74 into one or more groups 80 and defining a corresponding group boundary 84 around each of the groups 80 (step 86). Although only a single group 80 of DSA target pattern 74 is shown, it is to be understood that depending upon the locations or relative positions of the DSA target patterns 74, the DSA target patterns 74 may be grouped into more than one group. In an exemplary embodiment, the DSA target patterns 74 may be grouped using a set of design rules or predetermined templates from a database library that defines spacing requirements for whether or not a particular DSA target pattern(s) 74 is to be included in a specific group 80. Alternatively, other grouping techniques known to those skilled in the art may be used to group the DSA target patterns 74.

In an exemplary embodiment, the group boundary 84 (or boundaries) is selected from a database library of predetermined polynomial shapes with predetermined sizes that are appropriately matched with the number, spacing, and relative positions of the DSA target patterns 74 in a particular group 80. The group boundary 84 represents an initial mask pattern 88. The term "initial mask pattern" is used herein to denote an initial approximation of a photomask pattern for lithographically defining a DSA directing pattern (e.g., a topographical feature for graphoepitaxy DSA called a confinement well) for forming DSA patterns that correspond to the DSA target patterns 74.

Figure 7:
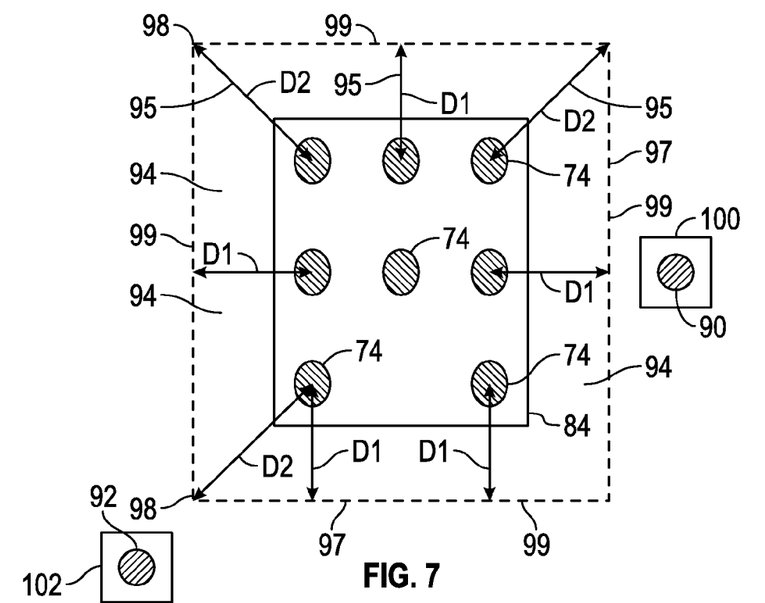

The method continues as illustrated in FIGS. 1 and 7 by determining, using the computing system, if any neighboring DSA target patterns 90 and 92 that are positioned adjacent to and outside of the group boundary 84 are too close (e.g., based on the reticle feasibility limit) to the DSA target patterns 74 that are within the group boundary 84 (step 96). In one example, if any of the neighboring DSA target patterns 90 and/or 92 are disposed within an outer surrounding space 94 immediately surrounding the group boundary 84, those neighboring DSA target patterns 90 and/or 92 are considered too close (e.g., space violation(s)). In an exemplary embodiment, the predetermined minimal keep-away distance 95 is used to determine if there are any space violations between the neighboring DSA target patterns 90 and 92 and the DSA target patterns 74 that are within the group boundary 84. As illustrated, in an exemplary embodiment, an outer-most perimeter edge (indicated by dashed line 97) of the outer surrounding space 94 is defined by the predetermined minimal keep-away distance 95 (step 96) in which the corner regions 98 of the outer-most perimeter edge 97 are correspondingly spaced apart from the adjacent DSA target patterns 74 (e.g., from the centers of the adjacent DSA target patterns 74) the predetermined corner-to-corner confinement well resolution minimal keep-away distance (D2) (discussed above in relation to FIG. 3); and the intermediate edge regions 99 of the outer-most perimeter edge 97 are spaced apart from the adjacent DSA target patterns 74 (e.g., from the centers of the adjacent DSA target patterns 74) the predetermined edge-to-edge confinement well resolution minimal keep-away distance (D1) (discussed above in relation to FIG. 2). As illustrated in FIG. 7, the neighboring DSA target patterns 90 and 92 are outside of the outer surrounding space 94 and therefore, are spaced apart from the DSA target patterns 74 that are within the group boundary 84 a sufficient distance (e.g., at or just above the reticle feasibility limit) to be considered manufacturing feasible using the DSA process. As such, corresponding group boundaries 100 and 102 are appropriately defined around the neighboring DSA target patterns 90 and 92 to be used further downstream in the DSA process to form corresponding confinement wells for forming DSA patterns having shapes that accurately match the shapes of the neighboring DSA target patterns 90 and 92.

Figure 8:
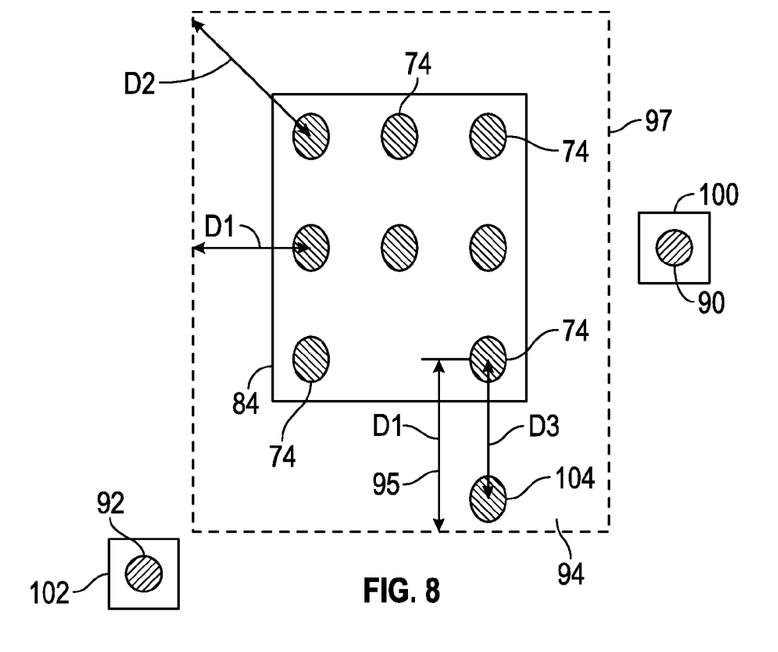

FIG. 8 illustrates a neighboring DSA target pattern 104 that is positioned adjacent to and outside of the group boundary 84 and that is too close (e.g., space violation based on the reticle feasibility limit) to the DSA target patterns 74 that are within the group boundary 84. In an exemplary embodiment, the neighboring DSA target pattern 104 is spaced apart from an adjacent DSA target patterns 74 that is within the group boundary 84 a distance (indicated by double headed arrow D3) that is less than the predetermined minimal keep-away distance 95 (e.g., the predetermined edge-to-edge confinement well resolution minimal keep-away distance (D1)) and is within the outer surrounding space 94. As such, it will be challenging or infeasible to accurately or fully form DSA patterns that correspond to the DSA target patterns 74 and the neighboring DSA target pattern 104 using the DSA process given the particular grouping of DSA target patterns 74 and the proximity of the neighboring DSA target pattern 104 to the DSA target patterns 74.

Figure 9:
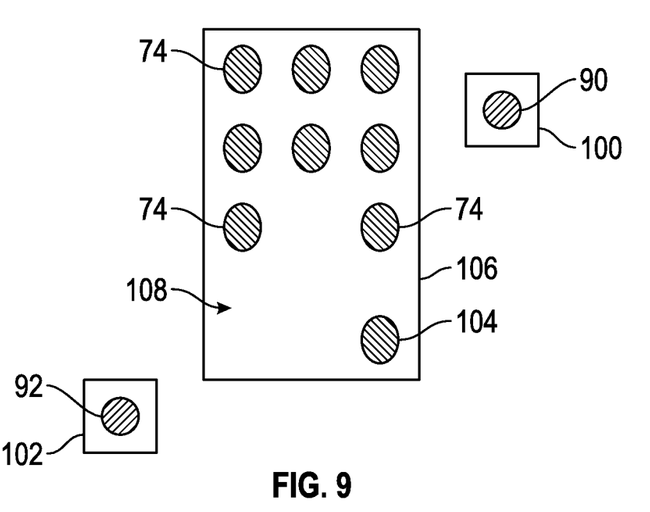
Figure 10A:
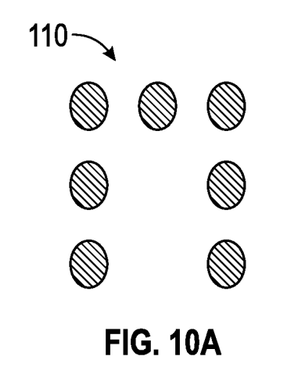
Figure 10B:
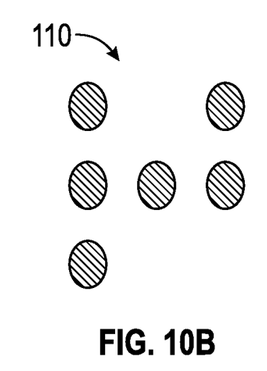
Figure 10C:
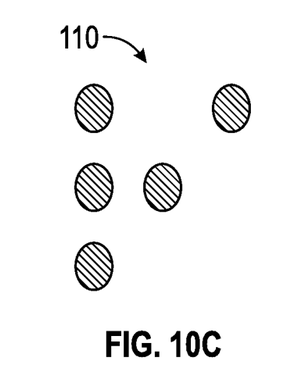
Figure 10D:
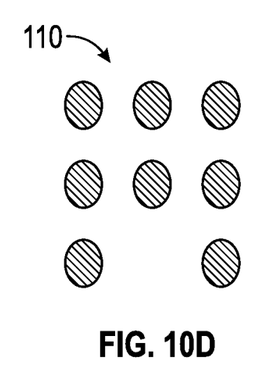

Referring to FIGS. 1 and 8-9, in an exemplary embodiment, to eliminate any space violation between the DSA target patterns 74 and the neighboring DSA target pattern 104, the group boundary 84 is adjusted (step 105) to include the neighboring DSA target pattern 104 and to define an adjusted group boundary 106 that surrounds an adjusted group 108 of the DSA target patterns 74 and 104. The adjusted group boundary 106 is then evaluated to determine if there are any other space violations with other neighboring DSA target patterns 90 and/or 92 that are outside of the adjusted group boundary 106 using the predetermined minimal keep-away distance 95 as discussed above. If there are any other space violations with the other neighboring DSA target patterns 90 and/or 92, further adjustments are made to the adjusted group boundary 106 to eliminate these space violations, such as, for example, by incorporating these other neighboring DSA target patterns 90 and/or 92 into the adjusted group 108 and further modifying the adjusted group boundary 106 to include the other neighboring DSA target patterns 90 and/or 92.

Figure 11A:
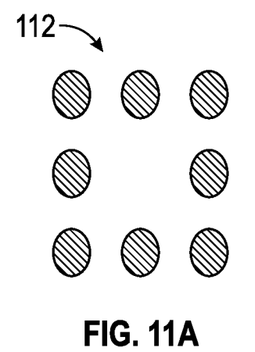
Figure 11B:
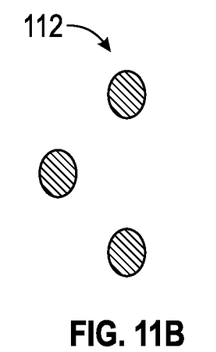
Figure 11C:
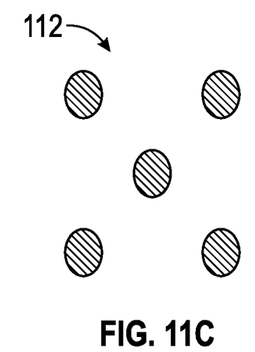
Figure 12A:
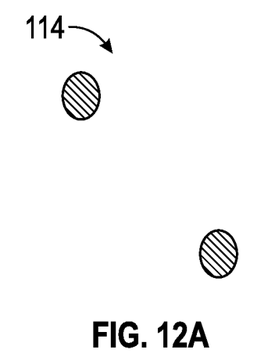
Figure 12B:
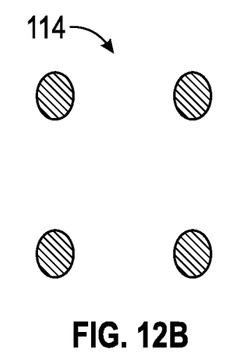

Referring to FIGS. 1, 7, and 9, in an exemplary embodiment, the method 10 continues by determining the DSA compatibility (step 109) of the DSA target patterns 74 in the group boundary 84 (e.g., if no adjustments to the group boundary 84 were made) or of the DSA target patterns 74 and 104 in the adjusted group boundary 106 (e.g., if adjustments to the group boundary 84 have been made). A DSA target pattern(s) that is DSA compatible is herein understood to be a DSA target pattern(s) that can be accurately or fully fabricated on a semiconductor substrate via the DSA process. In an exemplary embodiment, the DSA compatibility of the DSA target patterns 74 (or DSA target patterns 74 and 104) is determined by, using the computing system and a DSA pattern library (e.g., database), comparing the DSA target patterns 74 (or DSA target patterns 74 and 104) in the group boundary 84 (or the adjusted group boundary 106) to acceptable DSA target patterns (e.g., predetermined patterns that can be accurately or fully fabricated on a semiconductor substrate via the DSA process) for example as illustrated in FIGS. 10a-10d, possibly acceptable DSA target patterns 112 (e.g., predetermined patterns that may be accurately or fully fabricated on a semiconductor substrate via the DSA process with some modification to the group boundary 84 or the adjusted group boundary 106) for example as illustrated in FIGS. 11a-11c, and/or unacceptable DSA target patterns 114 (e.g., predetermined patterns that cannot be accurately or fully fabricated on a semiconductor substrate via the DSA process) for example as illustrated in FIGS. 12a-12b.

In an exemplary embodiment, if the DSA target patterns 74 (or DSA target patterns 74 and 104) are DSA compatible, a DSA model is used to adjust or modify the group boundary 84 (or the adjusted group boundary 106) to generate an output mask pattern (step 116). In particular, the DSA model is used to simulate the DSA fabricated patterns) given the group boundary 84 (or the adjusted group boundary 106) taking into account the physical effects that occur during the DSA process including annealing and etching of the self-assembly material. Various DSA models, such as Monde-Carlo-Based, SCFT-Based, and Fast-Compacted DSA models, are known and may be used for simulation.

With reference also to FIG. 4, in an exemplary embodiment, if the DSA target patterns 74 (or DSA target patterns 74 and 104) are not DSA compatible, the design layout 62 is redesigned (step 116). In particular, redesigning the design layout 62 includes repositioning the lines 64 and/or 68 to move the locations and/or relative positions of the contact hole patterns 72 (e.g., DSA target patterns 74). Next, using the repositioned DSA target patterns, the steps of identifying the placement of the DSA target patterns (step 76), grouping the DSA target patterns (step 86), determining space violations (step 96), and determining DSA compatibility (step 109) are repeated to generate the output mask pattern (step 116).

Referring to FIG. 1, the method 10 continues by communicating the output mask patterns to a mask writer and writing on the photomask (step 118) to produce a patterned photomask. Because a multitude of physical effects of the DSA process have been accounted for in defining the output mask pattern, the patterned photomask can be used to lithographically define a DSA directing pattern that accurately forms the shape of the DSA pattern(s).

The method 10 continues by forming the DSA directing pattern overlying a semiconductor substrate (step 120). Forming the DSA directing pattern (step 120) includes patterning a photoresist layer (step 122) that overlies the semiconductor substrate 124 using the patterned photomask. In an exemplary embodiment, the photoresist layer can be patterned with the patterned photomask using well known optical or EUV lithographic techniques. In one embodiment, the photoresist layer is patterned for forming the DSA directing pattern having a graphoepitaxy surface as is known in the art. In an exemplary embodiment, the graphoepitaxy surface includes confinement wells that define pre-pattern openings.

The method 10 continues by forming the DSA pattern (step 126). In an exemplary embodiment, the DSA pattern is formed (step 126) by depositing a self-assembly material (BCP) on the graphoepitaxy surface including into the pre-pattern opening (step 128). In an exemplary embodiment, the self-assembly material is a block copolymer. Non-limiting examples of block copolymers include polystyrene-block-polymethylmethacrylate (PS-b-PMMA), polystyrene-block-polybutadiene (PS-b-PB), polystyrene-block-poly(2-vinyl pyridine (PS-b-P2VP), polystyrene-block-polydimethylsiloxane (PS-b-PDMS), and polystyrene-block-polyethylene oxide (PS-b-PEO). The self-assembly material is then annealed (step 130) and etched (step 132) to define the DSA pattern. The self-assembly material may be deposited, annealed, and etched as described above using well known techniques. In an exemplary embodiment, the self-assembly material is deposited using a spin coating process, is annealed at a temperature of from about 125 to about 350° C. for a time from about 1 minute to about 24 hours, and is etched using a dry etching process, e.g., a plasma etching process.

Figure 13:
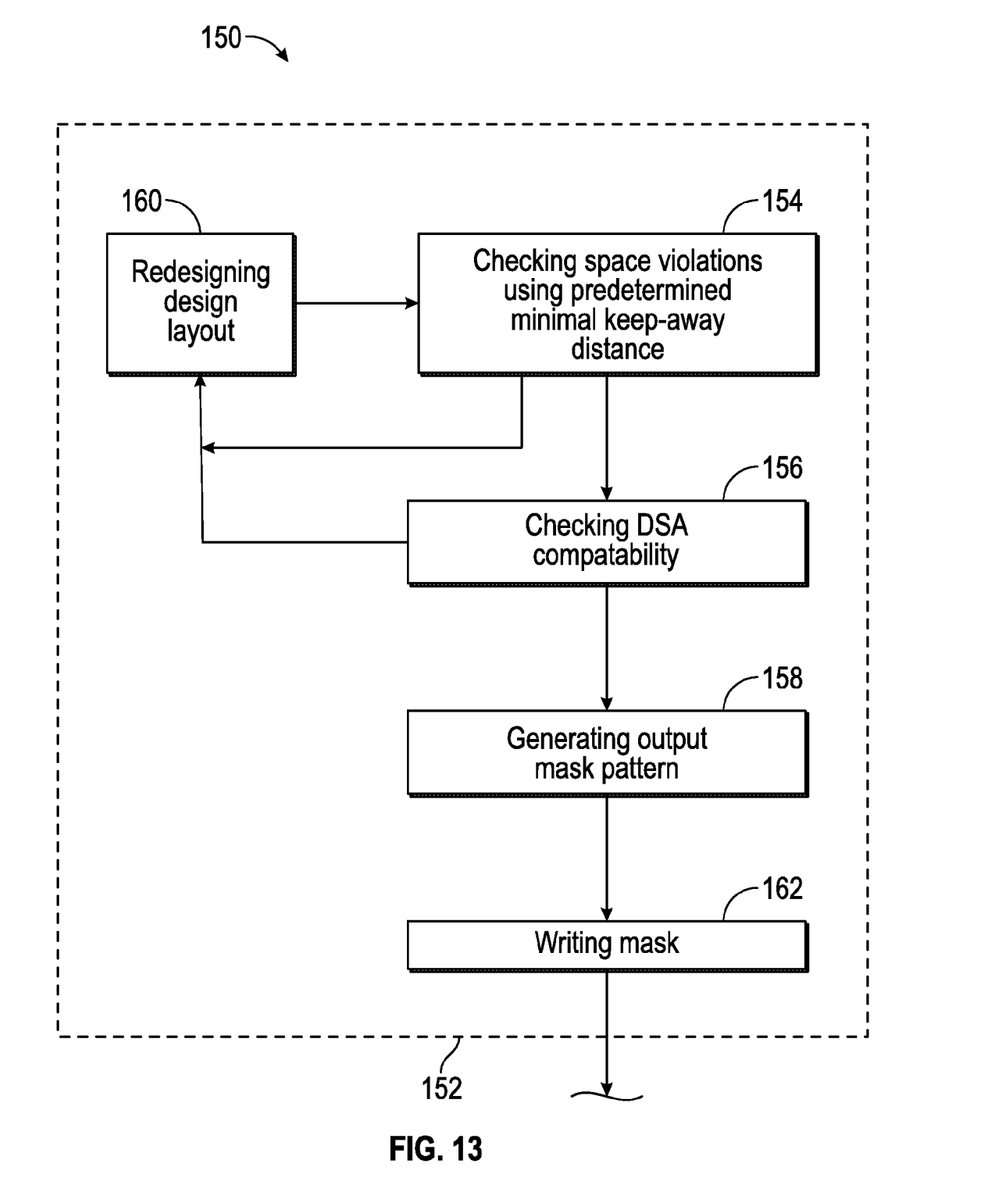
FIG. 13 is a block diagram of a method for fabricating an integrated circuit in accordance with an exemplary embodiment.

FIG. 13 is a block diagram of a method 150 for fabricating an integrated circuit in accordance with an exemplary embodiment. The method 150 includes generating a photomask (step 152) for forming a DSA directing pattern overlying a semiconductor substrate. The DSA directing pattern is for guiding a DSA material deposited on the DSA directing pattern during a DSA process in which the DSA material undergoes directed self-assembly to form a DSA pattern.

Generating the photomask (step 152) includes, using a computing system, checking DSA target patterns in a design layout for space violations using design rules (step 154) that include a predetermined minimal keep-away distance (e.g., a predetermined edge-to-edge confinement well resolution minimal keep-away distance (D1) and/or a predetermined corner-to-corner confinement well resolution minimal keep-away distance (D2) as discussed above in relation to FIGS. 7-8). In an exemplary embodiment, the DSA target patterns are grouped into groups including a first group that is within a first group boundary. Checking the DSA target patterns includes checking if a neighboring DSA target pattern that is positioned adjacent to and outside of the first group boundary is less than a predetermined minimal keep-away distance from an adjacent DSA target pattern that is within the first group boundary.

The DSA target patterns in the first group are compared to acceptable DSA target patterns and/or unacceptable DSA target patterns that are contained in a DSA pattern library to determine if the DSA target patterns in the first group are DSA compatible (step 156). If the DSA target patterns in the first group are DSA compatible, the first group boundary is used to generate an output mask pattern (step 158).

If the neighboring DSA target pattern is less than the predetermined minimal keep-away distance from the adjacent DSA target pattern that is within the first group boundary and/or if the DSA target patterns in the first group are DSA incompatible, the design layout is redesigned (step 160) to define a redesigned layout with repositioned DSA target patterns. In an exemplary embodiment, the repositioned DSA target patterns are grouped into repositioned groups including a first repositioned group that is within a first repositioned group boundary. The repositioned DSA target patterns are checked for space violations (step 154) including checking if a repositioned neighboring DSA target pattern that is positioned adjacent to and outside of the first repositioned group boundary is less than the predetermined minimal keep-away distance from a repositioned adjacent DSA target pattern that is within the first repositioned group boundary. Next, the repositioned DSA target patterns in the first repositioned group are compared to the acceptable DSA target patterns and/or the unacceptable DSA target patterns that are contained in the DSA pattern library to determine if the repositioned DSA target patterns in the first repositioned group are DSA compatible (step 156). If the repositioned DSA target patterns in the first repositioned group are DSA compatible, then the first repositioned group boundary is used to generate the output mask pattern (step 158).

The method 150 continues by communicating the output mask pattern to a mask writer and writing on the photomask (step 162) to produce the patterned photomask. The patterned photomask is used to form the DSA directing pattern and the corresponding DSA pattern as previously discussed above in relation to FIG. 1.

Figure 14:
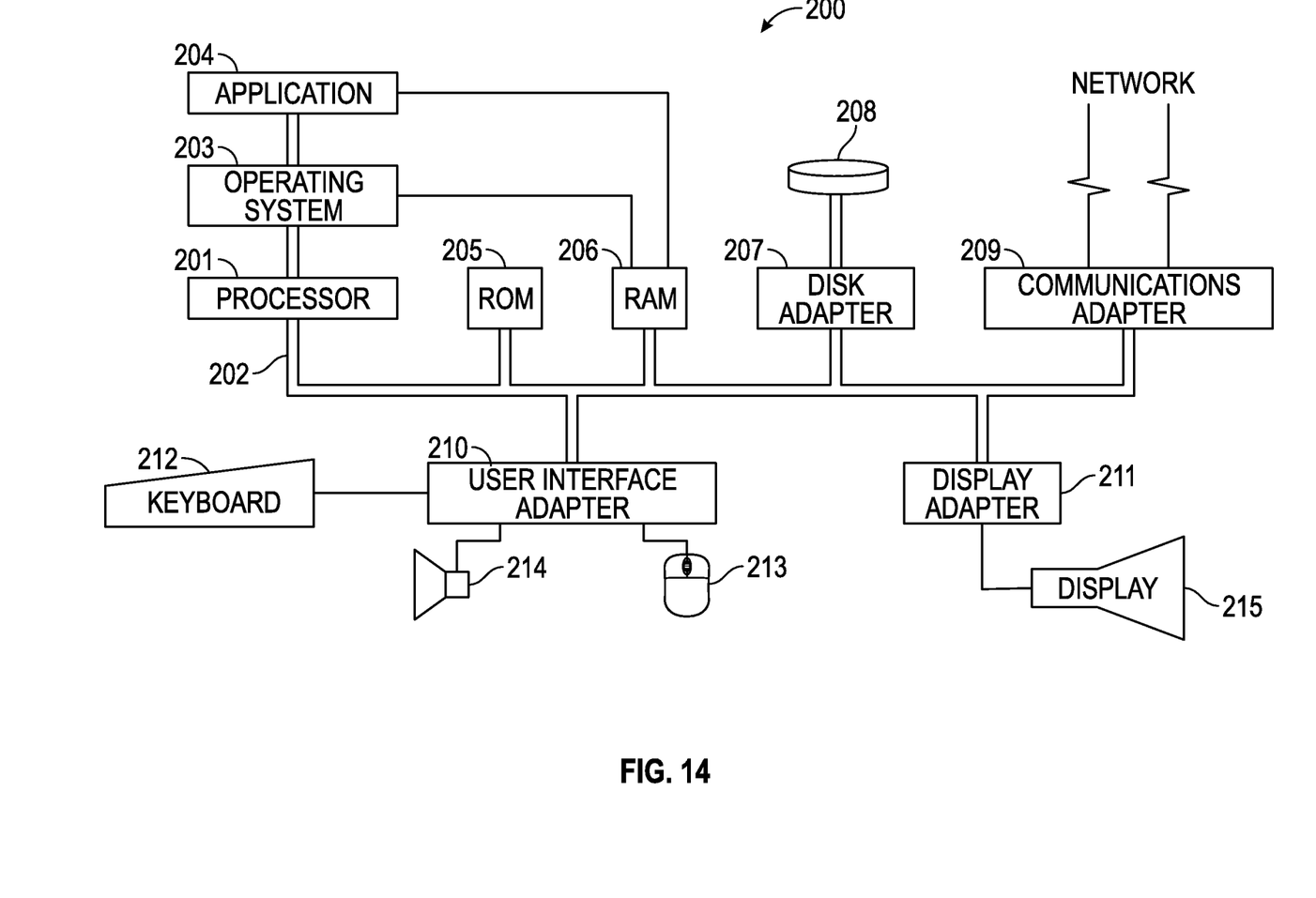
FIG. 14 is a schematic illustration of a computing system arranged in accordance with an exemplary embodiment.

FIG. 14 is a schematic illustration of a block diagram of a computing system 200 arranged in accordance with an exemplary embodiment. The various embodiments disclosed herein can be implemented on the computing system 200. The computing system 200 is also representative of a hardware environment for the present disclosure. For example, the computing system 200 may have a processor 201 coupled to various other components by a system bus 202.

An operating system 203 may run on the processor 201 and provide control and coordinate the functions of the various components of FIG. 14. An application 204 in accordance with the principles of examples of the present disclosure may execute in conjunction with the operating system 203 and provide calls and/or instructions to the operating system 203 where the calls/instructions implement the various functions or services to be performed by the application 204.

A read-only memory ("ROM") 205 may be coupled to a system bus 202 and can include a basic input/output system ("BIOS") that can control certain basic functions of the computing system 200. A random access memory ("RAM") 206 and a disk adapter 207 may also be coupled to system bus 202. It should be noted that software components, including the operating system 203 and the application 204, may be loaded into a RAM 206, which may be computing system's main memory for execution. The disk adapter 207 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 208, e.g., disk drive.

The computing system 200 may further include a communications adapter 209 coupled to the system bus 202. The communications adapter 209 may interconnect the system bus 202 with an external network (not shown) thereby facilitating the computing system 200 to communicate with other similar and/or different devices.

Input/Output ("I/O") devices may also be connected to the computing system 200 via a user interface adapter 210 and a display adapter 211. For example, a keyboard 212, a mouse 213, and a speaker 214 may be interconnected to the system bus 202 through the user interface adapter 210. Data may be provided to the computing system 200 through any of these example devices. A display monitor 215 may be connected to the system bus 202 by any display adapter 211. In this example manner, a user can provide data or other information to the computing system 200 through the keyboard 212 and/or the mouse 213, and obtain output from the computing system 200 via the display 215 and/or the speaker 214.

Accordingly, methods for fabricating integrated circuits including generating photomasks for directed self-assembly have been described. The method includes generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes identifying placement of DSA target patterns in a design layout. The DSA target patterns are grouped into groups including a first group and a first group boundary is defined around the first group. The method further includes determining if a neighboring DSA target pattern to the first group boundary is at least a predetermined minimal keep-away distance from an adjacent DSA target pattern that is within the first group boundary. The method also includes determining if the DSA target patterns in the first group are DSA compatible. An output mask pattern is generated using the first group boundary.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
using a computing system, generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
identifying placement of DSA target patterns in a design layout;
grouping the DSA target patterns into groups including a first group and defining a first group boundary around the first group;
determining whether or not a neighboring DSA target pattern that is positioned adjacent to and outside of the first group boundary is at least a predetermined minimal keep-away distance from an adjacent DSA target pattern that is within the first group boundary and that is a closest one of the DSA target patterns in the first group to the neighboring DSA target pattern;
determining whether or not the DSA target patterns in the first group are DSA compatible when the neighboring DSA target pattern is at least the predetermined minimal keep-away distance from the adjacent DSA target pattern; and
generating an output mask pattern using the first group boundary when the DSA target patterns in the first group are DSA compatible.

2. The method of claim 1, wherein the predetermined minimal keep-away distance is a predetermined edge-to-edge confinement well resolution minimal keep-away distance (D1), and wherein determining whether or not the neighboring DSA target pattern is at least the predetermined minimal keep-away distance from the adjacent DSA target pattern comprises determining whether or not the neighboring DSA target pattern is at least the predetermined edge-to-edge confinement well resolution minimal keep-away distance (D1) from the adjacent DSA target pattern.

3. The method of claim 2, wherein determining whether or not the neighboring DSA target pattern is at least the predetermined minimal keep-away distance from the adjacent DSA target pattern further comprises:
determining whether or not another neighboring DSA target pattern that is positioned adjacent to and outside of the first group boundary proximate a corner of the first group boundary is at least a predetermined corner-to-corner confinement well resolution minimal keep-away distance (D2) from another adjacent DSA target pattern that is within the first group boundary proximate the corner of the first group boundary, and wherein determining whether or not the DSA target patterns in the first group are DSA compatible comprises:
determining whether or not the DSA target patterns in the first group are DSA compatible when the neighboring DSA target pattern is at least the predetermined edge-to-edge confinement well resolution minimal keep-away distance (D1) from the adjacent DSA target pattern and if the another neighboring DSA target pattern is at least the predetermined corner-to-corner confinement well resolution minimal keep-away distance (D2) from the another adjacent DSA target pattern.

4. The method of claim 1, wherein the predetermined minimal keep-away distance is a predetermined corner-to-corner confinement well resolution minimal keep-away distance (D2), and wherein determining whether or not the neighboring DSA target pattern is at least the predetermined minimal keep-away distance from the adjacent DSA target pattern comprises determining whether or not the neighboring DSA target pattern is at least the predetermined corner-to-corner confinement well resolution minimal keep-away distance (D2) from the adjacent DSA target pattern.

5. The method of claim 1, wherein identifying placement of the DSA target patterns comprises identifying placement of the DSA target patterns that are correspondingly contact hole patterns and/or other via patterns in the design layout.

6. The method of claim 1, wherein determining whether or not the DSA target patterns in the first group are DSA compatible comprises comparing the DSA target patterns in the first group to acceptable DSA target patterns and/or unacceptable DSA target patterns that are contained in a DSA pattern library to determine whether or not the DSA target patterns in the first group are DSA compatible.

7. The method of claim 1, wherein generating the photomask comprises generating an optical lithography photomask.

8. The method of claim 1, wherein generating the photomask comprises generating an EUV lithography photomask.

9. The method of claim 1, further comprising:
patterning a photoresist layer overlying the semiconductor substrate using the photomask.

10. The method of claim 9, wherein patterning the photoresist layer comprises patterning the photoresist layer to form the DSA directing pattern having a graphoepitaxy surface that defines a pre-pattern opening.

11. The method of claim 10, further comprising depositing the self-assembly material on the graphoepitaxy surface including into the pre-pattern opening.

12. The method of claim 11, further comprising phase separating the self-assembly material to define the DSA pattern.

13. The method of claim 12, further comprising etching the DSA pattern to form a mask for transferring the DSA pattern to the semiconductor substrate.

14. The method of claim 1, wherein using the first group boundary to generate the output mask pattern comprises using a DSA model, adjusting the first group boundary to generate the output mask pattern.

15. A method for fabricating an integrated circuit comprising:
using a computing system, generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
identifying placement of DSA target patterns in a design layout;
grouping the DSA target patterns into groups including a first group and defining a first group boundary around the first group;
determining whether or not a neighboring DSA target pattern that is positioned adjacent to and outside of the first group boundary is less than a predetermined minimal keep-away distance from an adjacent DSA target pattern that is within the first group boundary;
adjusting the first group boundary to include the neighboring DSA target pattern and the first group to define an adjusted first group boundary around an adjusted first group that includes the first group and the neighboring DSA target pattern when the neighboring DSA target pattern is less than the predetermined minimal keep-away distance from the adjacent DSA target pattern;
determining whether or not the DSA target patterns in the adjusted first group are DSA compatible; and
generating an output mask pattern using the adjusted first group boundary when the DSA target patterns in the adjusted first group are DSA compatible.

16. The method of claim 15, wherein determining whether or not the DSA target patterns in the adjusted first group are DSA compatible comprises comparing the DSA target patterns in the adjusted first group to acceptable DSA target patterns and/or unacceptable DSA target patterns that are contained in a DSA pattern library to determine whether or not the DSA target patterns in the adjusted first group are DSA compatible.

17. The method of claim 15, wherein using the adjusted first group boundary to generate the output mask pattern comprises using a DSA model, adjusting the adjusted first group boundary to generate the output mask pattern.

18. A method for fabricating an integrated circuit comprising:
using a computing system, generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
checking DSA target patterns that are defined in a design layout and that are grouped into groups including a first group that is within a first group boundary, and wherein checking the DSA target patterns comprises:
checking whether or not a neighboring DSA target pattern that is positioned adjacent to and outside of the first group boundary is less than a predetermined minimal keep-away distance from an adjacent DSA target pattern that is within the first group boundary; and
comparing the DSA target patterns in the first group to acceptable DSA target patterns and/or unacceptable DSA target patterns that are contained in a DSA pattern library to determine whether or not the DSA target patterns in the first group are DSA compatible; and
generating an output mask pattern using the first group boundary when the DSA target patterns in the first group are DSA compatible.

19. The method of claim 18, further comprising:
redesigning the design layout to define a redesigned layout with repositioned DSA target patterns when the neighboring DSA target pattern is less than the predetermined minimal keep-away distance from the adjacent DSA target pattern that is within the first group boundary and/or when the DSA target patterns in the first group are DSA incompatible;
checking the repositioned DSA target patterns grouped into repositioned groups including a first repositioned group that is within a first repositioned group boundary, and wherein checking the repositioned DSA target patterns comprises:
checking whether or not a repositioned neighboring DSA target pattern that is positioned adjacent to and outside of the first repositioned group boundary is less than the predetermined minimal keep-away distance from a repositioned adjacent DSA target pattern that is within the first repositioned group boundary; and
comparing the repositioned DSA target patterns in the first repositioned group to the acceptable DSA target patterns and/or the unacceptable DSA target patterns that are contained in the DSA pattern library to determine whether or not the repositioned DSA target patterns in the first repositioned group are DSA compatible, and wherein generating the output mask pattern comprises generating the output mask pattern using the first repositioned group boundary when the repositioned DSA target patterns in the first repositioned group are DSA compatible.

* * * * *